United States Patent
Göötz et al.

(10) Patent No.: US 10,418,529 B2
(45) Date of Patent: Sep. 17, 2019

(54) CONVERSION ELEMENT, METHOD OF PRODUCING A CONVERSION ELEMENT, OPTOELECTRONIC DEVICE COMPRISING A CONVERSION ELEMENT

(71) Applicants: OSRAM Opto Semiconductors GmbH, Regensburg (DE); OSRAM GmbH, München (DE)

(72) Inventors: Britta Göötz, Regensburg (DE); Frank Singer, Regenstauf (DE); Roland Hüttinger, Kaufering (DE)

(73) Assignees: OSRAM Opto Semiconductors GmbH, Regensburg (DE); OSRAM GmbH, München (DE)

( * ) Notice: Subject to any disclaimer, the term of this patent is extended or adjusted under 35 U.S.C. 154(b) by 0 days.

(21) Appl. No.: 15/104,434

(22) PCT Filed: Dec. 15, 2014

(86) PCT No.: PCT/EP2014/077818
§ 371 (c)(1),
(2) Date: Jun. 14, 2016

(87) PCT Pub. No.: WO2015/091388
PCT Pub. Date: Jun. 25, 2015

(65) Prior Publication Data
US 2016/0315231 A1    Oct. 27, 2016

(30) Foreign Application Priority Data

Dec. 19, 2013  (DE) .................. 10 2013 114 548
Mar. 4, 2014   (DE) .................. 10 2014 102 848

(51) Int. Cl.
H01L 33/50        (2010.01)

(52) U.S. Cl.
CPC .......... H01L 33/504 (2013.01); H01L 33/505 (2013.01); *H01L 2933/0041* (2013.01)

(58) Field of Classification Search
USPC ....................................................... 257/98
See application file for complete search history.

(56) References Cited

U.S. PATENT DOCUMENTS

| | | |
|---|---|---|
| 9,540,563 B2 | 1/2017 | Daimon et al. |
| 2003/0080341 A1 | 5/2003 | Sakano et al. |
| 2005/0135079 A1 | 6/2005 | Yin Chua et al. |

(Continued)

FOREIGN PATENT DOCUMENTS

| | | |
|---|---|---|
| CN | 101490211 | 7/2009 |
| CN | 102363728 | 2/2012 |

(Continued)

OTHER PUBLICATIONS

Notice of Reasons for Rejection dated Aug. 1, 2017, of corresponding Japanese Application No. 2016-541153 in English.

*Primary Examiner* — Timor Karimy
(74) *Attorney, Agent, or Firm* — DLA Piper LLP (US)

(57) ABSTRACT

A conversion element includes a platelet including an inorganic glass, and first converter particles having a shell and a core, wherein the shell includes an inorganic material and the core includes a nitride or oxynitride luminescent material and the first converter particles are arranged on and/or in the platelet.

16 Claims, 2 Drawing Sheets

(56) References Cited

U.S. PATENT DOCUMENTS

| | | | |
|---|---|---|---|
| 2006/0226759 A1* | 10/2006 | Masuda | C09K 11/0883 |
| | | | 313/486 |
| 2010/0051868 A1 | 3/2010 | Le-Mercier et al. | |
| 2011/0025951 A1* | 2/2011 | Jones | H01L 33/50 |
| | | | 349/70 |
| 2011/0305005 A1 | 12/2011 | Tsukatani et al. | |
| 2012/0241672 A1 | 6/2012 | Buissette et al. | |
| 2013/0002124 A1* | 1/2013 | Izumi | H01L 33/504 |
| | | | 313/498 |
| 2013/0207073 A1 | 8/2013 | Bawendi et al. | |
| 2014/0127464 A1 | 5/2014 | Eberhardt et al. | |
| 2014/0141205 A1 | 5/2014 | Eberhardt et al. | |
| 2015/0136229 A1* | 5/2015 | Suto | H01L 31/035218 |
| | | | 136/257 |

FOREIGN PATENT DOCUMENTS

| | | |
|---|---|---|
| CN | 102498187 | 6/2012 |
| DE | 10 2005 045 106 A1 | 6/2006 |
| DE | 10 2011 078 663 A1 | 1/2013 |
| DE | 10 2011 078 689 A1 | 1/2013 |
| DE | 10 2011 087 614 A1 | 6/2013 |
| EP | 1 473 347 A1 | 11/2004 |
| EP | 1 473 348 A1 | 11/2004 |
| JP | 2006-083219 | 3/2006 |
| JP | 2006-517674 | 7/2006 |
| JP | 2013-203822 | 10/2013 |
| JP | 2013-247067 | 12/2013 |
| WO | 2007/082663 A1 | 7/2007 |
| WO | 2013084921 A1 | 6/2013 |
| WO | 2013/121355 | 8/2013 |
| WO | 2013/144777 | 10/2013 |

\* cited by examiner

CONVERSION ELEMENT, METHOD OF PRODUCING A CONVERSION ELEMENT, OPTOELECTRONIC DEVICE COMPRISING A CONVERSION ELEMENT

TECHNICAL FIELD

This disclosure relates to a conversion element, a method of producing a conversion element and an optoelectronic device comprising a conversion element.

BACKGROUND

Optoelectronic devices such as, e.g., light-emitting diodes (LEDs) frequently have conversion elements comprising a luminescent material. Luminescent materials convert the radiation emitted by a radiation source into a radiation having a changed, e.g., longer, wavelength. Heat is produced in addition to the emitted changed radiation. Conventional conversion elements frequently have silicone as the matrix for the luminescent materials. However, silicone inadequately dissipates heat produced by the luminescent material. This produces heat accumulation in the conversion elements, which leads to a reduction in luminous intensity, a change in the chromaticity coordinate and premature selection of the LED.

It could therefore be helpful to provide a conversion element having improved properties and that can be produced in a cost-effective manner.

SUMMARY

We provide a conversion element including a platelet including an inorganic glass, and first converter particles having a shell and a core, wherein the shell includes an inorganic material and the core includes a nitride or oxynitride luminescent material and the first converter particles are arranged on and/or in the platelet.

We also provide a method of producing the conversion element including coating particles of a nitride or oxynitride luminescent material with an inorganic material selected from the group consisting of SiO2, TiO, TiO2, Al2O3, B2O3, ZrO, ZrO2, ZnO, ZnO2, an inorganic-organic hybrid material, AlN, BN, TiN, Si3N4, ZrN, Zn3N2, graphene and combinations thereof to form first converter particles having a shell consisting of the inorganic material and a core consisting of the nitride or oxynitride luminescent material.

We further provide an optoelectronic device including a layer sequence having an active layer that emits electromagnetic primary radiation during operation of the device, at least one conversion element arranged in a beam path of the electromagnetic primary radiation and over the layer sequence, wherein the first converter particles convert the electromagnetic primary radiation at least partially into an electromagnetic secondary radiation.

DETAILED DESCRIPTION

Figure 1A:
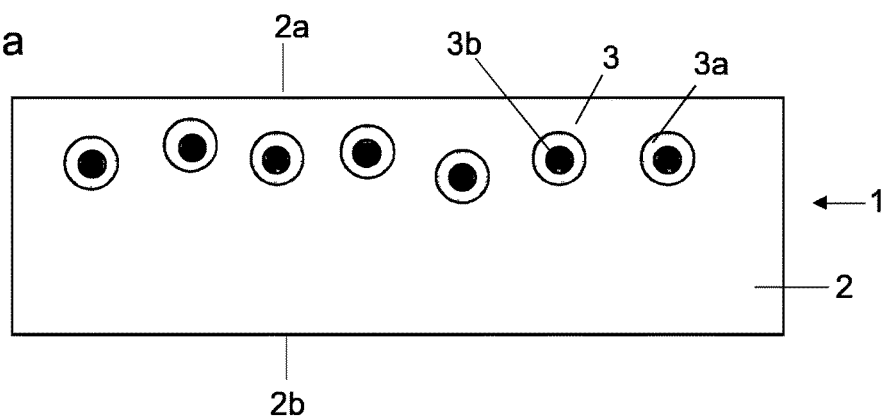
FIGS. 1a, 1b, 2a and 2b show schematic side views of different examples of conversion elements.

Our conversion element comprises a platelet comprising an inorganic glass and first converter particles. The first converter particles have a shell and a core, wherein the shell comprises an inorganic material and the core comprises a nitride or oxynitride luminescent material. The first converter particles are arranged on and/or in the platelet comprising the inorganic glass.

The fact that the first converter particles are arranged in the platelet comprising the inorganic glass means that the first converter particles are completely or partially embedded into the platelet, i.e. into the inorganic glass of the platelet. For example, in partial embedding, 20% to 99.9% of the surface of the shell of the first converter particles can be surrounded by the inorganic glass of the platelet or can be in direct mechanical contact therewith.

Some of the first converter particles may be arranged on the platelet and some of the first converter particles may be arranged in the platelet.

The core may consist of a nitride or oxynitride luminescent material, in particular nitride or oxynitride luminescent material particles. Preferably, the core consists of a nitride luminescent material or nitride luminescent material particles.

A conversion element comprising an inorganic glass can be used to very effectively dissipate heat in the conversion element produced by the first converter particles. This produces a low or negligible accumulation of heat in the conversion element. If the conversion element is a component of an optoelectronic device, a constant luminous intensity and a constant chromaticity coordinate can thus be guaranteed over the duration of the operating time of the optoelectronic device. Therefore, premature failure of the optoelectronic device can be prevented and the service life of the optoelectronic device can be prolonged.

The fact that a layer or an element is arranged or applied "on" or "over" another layer or another element means that the one layer or the one element is arranged in direct mechanical and/or electrical contact with the other layer or the other element. It may moreover also mean that the one layer or the one element is arranged indirectly on or over the other layer or the other element. In this case, further layers and/or elements may then be arranged between the one layer or the other layer or between the one element or the other element.

The platelet can consist of the inorganic glass or of the inorganic glass and the first converter particles.

The inorganic glass may have a refractive index $\eta_D(20°\text{C.})$ of 1.0 to 3.0, preferably 1.4 to 3.0, particularly preferably 1.9 to 3.0.

The inorganic glass may have a thermal conductivity of $0.5\ \text{W m}^{-1}\ \text{K}^{-1}$ to $3.0\ \text{W m}^{-1}\ \text{K}^{-1}$, preferably $0.6\ \text{W m}^{-1}\ \text{K}^{-1}$ to $1.5\ \text{W m}^{-1}\ \text{K}^{-1}$, particularly preferably $0.6\ \text{W m}^{-1}\ \text{K}^{-1}$ to $0.9\ \text{W m}^{-1}\ \text{K}^{-1}$.

The inorganic glass may be a silicate glass, a borate glass or a phosphate glass. The silicate glass contains $SiO_2$ as the main component, the borate glass contains $B_2O_3$ as the main component and the phosphate glass contains $P_2O_5$ as the main component. The silicate glass can contain further metal oxides such as $B_2O_3$, $P_2O_5$, $Na_2O$, $K_2O$, $Bi_2O_3$ and AgO, the borate glass can contain further metal oxides such as $SiO_2$, $P_2O_5$, $Na_2O$, $K_2O$, $Bi_2O_3$ and AgO and the phosphate glass can contain further metal oxides such as $B_2O_3$, $SiO_2$, $Na_2O$, $K_2O$, $Bi_2O_3$ and AgO. For example, the inorganic glass is a soda-lime glass.

The inorganic glass may be a tellurite glass. The tellurite glass contains $TeO_2$ as the main component, i.e. e.g. more than 40 wt. % or 50 wt. % or 65 wt. %. The tellurite glass can also contain one or a plurality of further metal oxides such as $Bi_2O_3$, $B_2O_3$, $SiO_2$, $K_2O$, $Na_2O$, $Nb_2O_3$, $Sb_2O_3$ and/or AgO or can consist of such metal oxides, together with $TeO_2$.

The platelet comprising or consisting of the inorganic glass may be transparent. The term "transparency" means that a material, a layer or an element is at least partially transmissive to the entire visible electromagnetic spectrum or a partial spectrum thereof.

Nitride and oxynitride luminescent materials are characterized by virtue of the fact that these luminescent materials have at least one $N^{3-}$ ion in their composition. Nitride luminescent materials do not have any oxygen atoms in their composition. Oxynitride luminescent materials have, in addition to $N^{3-}$ ions, at least one $O^{2-}$ ion in their composition. For example, the nitride luminescent material is a luminescent material of the formula $M_2Si_5N_8$ or $MAlSiN_3$ and the oxynitride luminescent material is a luminescent material of the formula $MSi_2N_2O_2$. In the aforementioned formulae, M represents an alkaline earth metal or combination of a plurality of alkaline earth metals. For example, M is selected from a group comprising Ba, Sr, Ca, Mg and combinations thereof. The oxynitride and nitride luminescent materials may be doped e.g. with one of the following activators or combinations of the following activators: cerium, europium, terbium, praseodymium, saramium, manganese. The luminescent materials are preferably doped with $Eu^{2+}$. For example, it is a red-emitting nitride luminescent material $(Ca,Sr,Ba)_2Si_5N_8:Eu^{2+}$ or $(Sr, Ba)_2Si_5N_8:Eu^{2+}$.

The nitride luminescent material may be a luminescent material that emits red light and the oxynitride luminescent material may be a luminescent material that emits green to orange light.

Nitride or oxynitride luminescent materials demonstrate a reaction with the inorganic glass that leads to a lower efficiency of the luminescent materials. We demonstrated that first converter particles comprising or consisting of a shell consisting of an inorganic material and a core consisting of a nitride or oxynitride luminescent material can be introduced into inorganic glass while still maintaining their efficiency. The nitride or oxynitride luminescent material located in the core of the first converter particles is protected from reacting with the inorganic glass by the shell comprising or consisting of the inorganic material. Therefore, the efficiency of the nitride or oxynitride luminescent materials can be retained and, in addition, the heat produced can be efficiently dissipated by the inorganic glass.

The inorganic material of the shell may be selected from a group comprising $SiO_2$, TiO, $TiO_2$, $Al_2O_3$, $B_2O_3$, ZrO, $ZrO_2$, ZnO, $ZnO_2$, an inorganic-organic hybrid material, AlN, BN, TiN, $Si_3N_4$, ZrN, $Zn_3N_2$, graphene and combinations thereof. Preferably, the inorganic material of the shell is selected from a group comprising $SiO_2$, TiO, $B_2O_3$, ZrO, an inorganic-organic hybrid material, AlN, TiN, $Si_3N_4$ and combinations thereof.

The shell can consist of the inorganic material.

The inorganic-organic hybrid material may comprise Si—O—Si bonds.

The inorganic-organic hybrid material may be produced by hydrolysis and condensation of tetraethoxysilane and/or tetramethoxysilane, preferably tetraethoxysilane. In particular, the method of producing the inorganic-organic hybrid material is a sol-gel process.

The first converter particles can have cores comprising different nitride and/or oxynitride luminescent materials and also different shells. For example, the first converter particles can be composed of first converter particles comprising a core consisting of a nitride luminescent material and first converter particles comprising a core consisting of an oxynitride luminescent material. The first converter particles can have identical or different shells.

The platelet has two major surfaces. The first major surface is designated as the one which the first converter particles are spatially closest to and generally corresponds to the surface to which the converter particles have been applied during the production of the converter element. The major surface opposite to the first major surface is designated as the second major surface.

The conversion element may have a thickness of 100 μm to 200 μm. Preferably, the conversion element has a thickness of 150 μm to 200 μm.

The first converter particles may have a diameter of 10 μm to 100 μm, preferably 10 μm to 50 μm, particularly preferably 10 μm to 30 μm. A diameter can be in particular the D50 diameter determined, for example, in Q0.

The shell can have a thickness of 10 nm to 50 μm, preferably 100 nm to 5 μm, particularly preferably. The selection of the thickness can be selected differently depending upon the production method. If the shell has a high density, a small thickness can be selected.

The platelet may have a protective layer arranged thereover comprising a material selected from a group comprising parylene, polysilazane, silicone, $SiO_2$, TiO, $TiO_2$, $Al_2O_3$, $B_2O_3$, ZrO, $ZrO_2$, ZnO, $ZnO_2$, an inorganic-organic hybrid material, AlN, BN, TiN, $Si_3N_4$, ZrN, $Zn_3N_2$, graphene, an inorganic glass and combinations thereof. The inorganic-organic hybrid material can be selected in the same manner as the inorganic-organic hybrid material of the shell. The inorganic glass can be selected from the same group as that stated for the inorganic glass of the platelet. Preferably, the material is selected from a group comprising parylene, polysilazane, silicone, $SiO_2$, AlN, TiN, $Si_3N_4$, ZrN, graphene, an inorganic glass and combinations thereof. Preferably, the protective layer is arranged over the first major surface of the platelet.

The same or different materials can be selected for the shell of the first converter particles and for the first protective layer. The platelet and the protective layer can comprise or consist of the same inorganic glass.

In particular, a protective layer is arranged over the platelet, preferably over the first major surface of the platelet, if the first converter particles are arranged on the platelet and/or are partially embedded in the platelet. The protective layer can completely cover the first converter particles.

The first converter particles may be completely embedded into the inorganic glass of the platelet and the material of the protective layer. In this example, the first converter particles are completely surrounded by the protective layer and the inorganic glass of the platelet and thus do not have any contact with the ambient air. In particular, direct mechanical contact exists between the shell of the first converter particles and the material of the protective layer and the inorganic glass of the platelet.

The first converter particles may be completely embedded into the inorganic glass of the platelet. In this example, the first converter particles are completely surrounded by the inorganic glass of the platelet and thus do not have any contact with the ambient air. In particular, direct mechanical contact exists between the shell of the first converter particles and the inorganic glass of the platelet.

A chemical bond and/or physical interactions may exist between the inorganic material of the shell of the first converter particles and the inorganic glass of the platelet. The chemical bond can be an ionic and/or a covalent bond.

Chemical bonds and/or physical interactions can exist between the material of the protective layer and the material of the shell of the first converter particles. For example, the chemical bonds are covalent and/or ionic bonds.

By the chemical bond of the first converter particles to the inorganic glass and/or the material of the protective layer, the first converter particles are fixedly integrated in the conversion element and are thus not subjected to any diffusion.

The conversion element may comprise second converter particles. The second converter particles are arranged on and/or in the platelet comprising the inorganic glass. The second converter particles can comprise or consist of an oxide luminescent material. Oxide luminescent materials mean luminescent materials containing at least one $O^{2-}$ ion and no $N^{3-}$ ions in their composition. The oxide luminescent materials that can be used are garnets, e.g. yttrium-aluminum-garnet (YAG) or lutetium-aluminum-garnet (LuAG). The oxide luminescent materials can be incorporated into or applied onto the inorganic glass of the platelet without the shell while still maintaining their efficiency.

The second converter particles may be completely embedded into the inorganic glass of the platelet. In this example, the second converter particles are completely surrounded by the inorganic glass of the platelet and thus do not have any contact with the ambient air. In particular, direct mechanical contact exists between the second converter particles and the inorganic glass of the platelet.

The platelet can consist of the inorganic glass and the first and second converter particles.

The platelet can consist of the inorganic glass and the second converter particles. The first converter particles are then arranged on the platelet.

The conversion element may comprise first converter particles that emit red light and second converter particles that emit yellow and/or green light.

An anti-reflective and/or reflective layer may be arranged on the platelet. The anti-reflective and/or reflective layer may be arranged preferably over the second major surface of the platelet. The anti-reflective and/or reflective layer can have a bandpass or edge filter characteristic. For example, an anti-reflective and/or reflective layer can be transmissive to radiation of specific wavelengths and reflective with respect to radiation of different wavelengths. A 3D structure is also possible which improves an outcoupling of light or includes a directional characteristic for light.

The conversion element can be produced in accordance with a method stated hereinafter. That is to say that all of the features indicated for the conversion element are also disclosed for the methods described herein, and vice versa.

A method of producing a conversion element preferably comprises the following method steps, in particular in the stated sequence:

A) coating particles of a nitride or oxynitride luminescent material with an inorganic material selected from a group comprising $SiO_2$, TiO, $TiO_2$, $Al_2O_3$, $B_2O_3$, ZrO, $ZrO_2$, ZnO, $ZnO_2$, an inorganic-organic hybrid material, AlN, BN, TiN, $Si_3N_4$, ZrN, $Zn_3N_2$, graphene and combinations thereof. This produces first converter particles having a shell consisting of an inorganic material and a core consisting of the nitride or oxynitride luminescent material;

B) providing a platelet comprising an inorganic glass;

C) fusing a surface layer of the platelet; and

E) applying the first converter particles to the fused surface layer.

The method of producing a conversion element preferably comprises the following method steps, in particular in the stated sequence:

A) coating particles of a nitride or oxynitride luminescent material with an inorganic material selected from a group comprising $SiO_2$, TiO, $TiO_2$, $Al_2O_3$, $B_2O_3$, ZrO, $ZrO_2$, ZnO, $ZnO_2$, an inorganic-organic hybrid material, AlN, BN, TiN, $Si_3N_4$, ZrN, $Zn_3N_2$, graphene and combinations thereof so that first and/or second converter particles are produced and have a shell consisting of an inorganic material and a core consisting of the nitride or oxynitride luminescent material;

B) producing a glass frit or a powder consisting of an inorganic glass, e.g. an inorganic glass stated above;

C) mixing the glass frit or the powder with the converter particles, a liquid dispersant and an optional binder so that a basic molding compound, which is also defined as a slurry, is produced, wherein the basic molding compound is preferably suitable for tape casting;

D) casting, in particular tape casting, the basic molding compound to form a crude conversion element body or to form the platelets, in particular a film, wherein the dispersant completely or partially evaporates;

E) optionally dividing up the crude conversion element body into the conversion elements, e.g. by sawing, breaking, cutting, chopping, punching or laser treatment, wherein immediately after step E) the conversion elements and/or the platelets can still have laterally larger dimensions than the finished conversion elements so that shrinkage during an optional sintering procedure is taken into account during the dividing-up procedure;

F) if a binder is used, removing the binder so that the inorganic glass and the converter particles, in particular exclusively the inorganic glass and the converter particles, remain;

G) sintering the platelets and/or the conversion elements and/or the crude conversion element body so that the inorganic glass becomes connected to the converter particles; and H) optionally shaping to form the platelets and/or the conversion elements from the crude conversion element body or shaping to form the conversion elements from the conversion elements and/or platelets obtained in step E, e.g. by sawing, grinding, laser-cutting, cutting, scoring and breaking, water jet cutting or punching to obtain the final shape of the conversion elements.

The sintering in step G is performed preferably at a temperature and over a period of time so that a solid, durable and mechanical stable conversion element and/or platelet is produced to establish in particular intimate contact between the inorganic glass and the converter particles. However, the temperature and the duration of the sintering are preferably selected such that the inorganic glass does not react with the cores of the converter particles.

The crude conversion element body is e.g. a ceramic film or a thin ceramic sheet comprising a plurality of conversion elements. The crude conversion element body is configured to be separated into the conversion elements.

In addition to these two methods described, the conversion element can also be produced by other methods.

The inorganic-organic hybrid material may comprise Si—O—Si bonds.

The inorganic-organic hybrid material may be produced by hydrolysis and condensation of tetraethoxysilane and/or tetramethoxysilane, preferably tetraethoxysilane. In particular, the method of producing the inorganic-organic hybrid material is a sol-gel process.

The platelet may have two major surfaces. In the produced conversion element, the major surface which the first converter particles are spatially closest to is defined as the first major surface. The major surface opposite to the first major surface is designated as the second major surface. In method step E), the first converter particles are applied to the first major surface of the platelet. The surface layer of the platelet in method step C) is the surface layer of the first major surface of the platelet.

By this method, it is possible to apply or introduce nitride and/or oxynitride luminescent materials onto or into a platelet consisting of inorganic glass. In particular, the efficiency of the nitride and/or oxynitride luminescent materials in the conversion element can be maintained by this method. This was hitherto impossible because nitride and/or oxynitride luminescent materials or luminescent material particles undergo a reaction with the fused inorganic glass. Located in the fused glass are mobile $O^{2-}$ ions that react with the nitride and/or oxynitride luminescent material. This undesired reaction leads to efficiency losses in the luminescent materials. By coating particles of a nitride or oxynitride luminescent material with an inorganic material, this reaction can be avoided and therefore efficiency of the luminescent materials can be maintained.

The platelet in method step B) may consist of the inorganic glass.

Second converter particles comprising an oxide luminescent material or consisting of an oxide luminescent material may be arranged in the platelet comprising an inorganic glass in method step B). The platelet can consist of the inorganic glass and the second converter particles.

When the first converter particles are applied to the fused surface layer in method step E), the shell of the first converter particles may be fused if it contacts the fused surface layer. In particular, the shell is not completely fused. This means that the inorganic material of the shell directly adjoining the core of the first converter particles is not fused. Therefore, the core, i.e. the nitride or oxynitride luminescent material can be efficiently protected against a reaction with the inorganic glass. By virtue of the fact that the inorganic material of the shell directly adjoining the core of the first converter particles is not fused, it is possible to use e.g. inorganic materials such as $SiO_2$. If the shell was completely fused, a shell consisting of e.g. $SiO_2$ would also be exposed to the risk of $O^{2-}$ ions undergoing a reaction with the nitride or oxynitride luminescent material.

The shell can have a thickness of 10 nm to 50 μm, preferably 100 nm to 5 μm. When selecting these thicknesses, it is possible to ensure that the inorganic material of the shell directly adjoining the core of the first converter particles is not fused.

Method step E) may be followed by a further method step of:

F) allowing the first converter particles to sink partially and/or completely into the fused surface layer.

Allowing the first converter particles to sink completely means that the first converter particles sink into the fused surface layer until the complete surface of the shell of the first converter particles is embedded into the fused glass or is in direct mechanical contact with the fused glass. Preferably, the first converter particles sink only until the first major surface of the platelet is spatially closer to the first converter particles than the second major surface of the platelet. Allowing the first converter particles to sink partially means that the first converter particles sink into the fused surface layer until 20% to 99.9% of the surface of the shell of the first converter particles is embedded into the inorganic glass of the platelet or is in direct mechanical contact therewith.

Physical interactions and/or chemical bonds, in particular ionic and/or covalent bonds, may be produced between the fused inorganic material of the shell of the first converter particles and the fused inorganic glass. The physical interactions and/or chemical bonds are produced after the first converter particles are applied to the fused surface layer in method step E) or after or when the first converter particles are allowed to sink partially and/or completely into the fused surface layer in method step F).

Method step C) may be followed by a further method step of: D) applying second converter particles comprising an oxide luminescent material to the fused surface layer. In particular, the second converter particles consist of the oxide luminescent material.

In contrast to nitride and oxynitride luminescent materials, although the oxide luminescent materials demonstrate an interaction with $O^{2-}$ ions of the fused inorganic glass, this interaction does not have any effect or has only a very slight effect upon the efficiency of the oxide luminescent material. Since the second converter particles are thus insensitive to the fused inorganic glass, they are preferably applied to the fused surface layer or applied thereto and are sunk therein before the first converter particles. Moreover, the second converter particles do not require a protective shell.

Method step D) may be followed by a further method step of: D1) allowing the second converter particles to sink completely into the fused surface layer.

If the surface layer is no longer fused after method step D1, method step C) can take place once again before method step E).

In method step E) the first and second converter particles may be simultaneously applied to the fused surface layer. Method step D1) can then take place after method step E).

A slurry or a gel comprising the inorganic material, or the inorganic material in a gaseous state of aggregation may be used to coat the particles of the nitride or oxynitride luminescent material in method step A). The slurry is a dispersion of the inorganic material in water or in an alcohol, e.g. ethanol. In addition, the slurry can contain a binder, e.g. polyvinyl alcohol. If a gel comprising the inorganic material is used, it is, e.g. a gel produced by a sol-gel process. For example, tetraethoxysilane can be used as a starting material in a sol-gel process or tetramethoxysilane can be used as a starting material. Hydrolysis and condensation produce in the sol-gel process an inorganic-organic hybrid material containing Si—O—Si bonds.

Method step E) or F) can be followed by a further method step of:

G) applying a protective layer comprising a material which is selected from a group comprising parylene, polysilazane, silicone, $SiO_2$, $TiO$, $TiO_2$, $Al_2O_3$, $B_2O_3$, $ZrO$, $ZrO_2$, $ZnO$, $ZnO_2$, an inorganic-organic hybrid material, AlN, BN, TiN, $Si_3N_4$, ZrN, $Zn_3N_2$, graphene, an inorganic glass and combinations thereof, to the first major surface of the platelet. In particular, the protective layer is applied if the first converter particles are arranged on the platelet or in method step F) are only partially sunk into the fused surface layer. If the protective layer comprises a material which is selected from a group comprising $SiO_2$, $TiO$, $TiO_2$, $Al_2O_3$, $B_2O_3$, $ZrO$, $ZrO_2$, $ZnO$, $ZnO_2$, AlN, BN, TiN, $Si_3N_4$, ZrN, $Zn_3N_2$, graphene and combinations thereof, it can be applied by a CVD (chemical vapor deposition) method.

Method step E), F) or G) can be followed by a further method step of:

H) applying an anti-reflective and/or reflective layer to the second major surface of the platelet.

The conversion element can be present in an optoelectronic device.

An optoelectronic device is also provided. The optoelectronic device comprises a layer sequence having an active layer that emits electromagnetic primary radiation during operation of the device. Furthermore, the optoelectronic device comprises at least one conversion element. The conversion element comprises a platelet comprising an inorganic glass and first converter particles. The first converter particles have a shell and a core, wherein the shell comprises an inorganic material and the core comprises a nitride or oxynitride luminescent material. The first converter particles are arranged on and/or in the platelet comprising the inorganic glass. The conversion element is arranged in the beam path of the electromagnetic primary radiation and over the layer sequence. The first converter particles convert the electromagnetic primary radiation at least partially into an electromagnetic secondary radiation.

Such an optoelectronic device comprising a conversion element as described above has a constant luminous intensity and a constant chromaticity coordinate over the duration of the operating time of the optoelectronic device because the inorganic glass can very effectively dissipate the heat in the conversion element produced by the first converter particles. Therefore, premature failure of the optoelectronic device can be prevented and the service life of the optoelectronic device can be prolonged.

The fact that converter particles convert the electromagnetic primary radiation at least partially into an electromagnetic secondary radiation can mean on the one hand that the electromagnetic primary radiation is partially absorbed by the converter particles and is emitted as secondary radiation having a wavelength range at least partially different from the primary radiation. In this case, some of the absorbed primary radiation is output by the converter particles as heat. The unabsorbed electromagnetic primary radiation can be emitted.

The fact that the converter particles convert the electromagnetic primary radiation at least partially into an electromagnetic secondary radiation can also mean that the electromagnetic primary radiation is almost completely absorbed by the converter particles and is output in the form of an electromagnetic secondary radiation and in the form of heat. The emitted radiation of the optoelectronic device in accordance with this example thus corresponds almost completely to the electromagnetic secondary radiation. An almost complete conversion is to be understood to mean a conversion of more than 95%, in particular more than 98%.

In this connection, a "layer sequence" is to be understood to be a layer sequence comprising more than one layer, e.g. a sequence of a p-doped and an n-doped semiconductor layer, wherein the layers are arranged one on top of the other.

The layer sequence can be designed as an epitaxial layer sequence or as a radiation-emitting semiconductor chip having an epitaxial layer sequence, i.e. as an epitaxially grown semiconductor layer sequence. The layer sequence can be designed, e.g. on the basis of InGaAlN. InGaAlN-based semiconductor chips and semiconductor layer sequences include in particular those in which the epitaxially produced semiconductor layer sequence comprises a layer sequence consisting of different individual layers and containing at least one individual layer comprising a material from the III-V-compound semiconductor material system $In_xAl_yGa_{1-x-y}N$ where $0 \leq x \leq 1$, $0 \leq y \leq 1$ and $x+y \leq 1$. Semiconductor layer sequences comprising at least one active layer on the basis of InGaAlN can emit, e.g. electromagnetic radiation in an ultraviolet to green wavelength range.

Alternatively or in addition, the semiconductor layer sequence or the semiconductor chip can also be based upon InGaAlP, that is to say that the semiconductor layer sequence can comprise different individual layers of which at least one individual layer comprises a material from the III-V-compound semiconductor material system $In_xAl_yGa_{1-x-y}P$ where $0 \leq x \leq 1$, $0 \leq y \leq 1$ and $x+y \leq 1$. Semiconductor layer sequences or semiconductor chips comprising at least one active layer on the basis of InGaAlP can emit, e.g. preferably electromagnetic radiation having one or a plurality of spectral components in a green to red wavelength range.

Alternatively or in addition, the semiconductor layer sequence or the semiconductor chip can also comprise other III-V-compound semiconductor material systems, e.g. an AlGaAs-based material or II-VI-compound semiconductor material systems. In particular, an active layer which has an AlGaAs-based material can emit electromagnetic radiation having one or a plurality of spectral components in a red to infrared wavelength range.

The active semiconductor layer sequence can comprise, in addition to the active layer, further functional layers and functional regions, for instance p- or n-doped charge carrier transport layers, i.e. electron or hole transport layers, undoped or p- or n-doped confinement, cladding or waveguide layers, barrier layers, planarization layers, buffer layers, protective layers and/or electrodes and combinations thereof. Furthermore, one or a plurality of reflective layers can be applied, e.g. on a side of the semiconductor layer sequence facing away from the growth substrate. The structures described in this case and relating to the active layer or the further functional layers and regions are known, in particular in relation to design, function and structure and therefore are not explained in more detail.

The conversion element may comprise second converter particles. The second converter particles are arranged on and/or in the platelet comprising the inorganic glass. Preferably, the second converter particles are completely embedded into the inorganic glass of the platelet. The second converter particles can comprise or consist of an oxide luminescent material.

If first and second converter particles are present in the conversion element, the first converter particles can be arranged spatially closer to the first major surface than the second converter particles.

If first and second converter particles are present in the conversion element, the electromagnetic secondary radiation is composed of the electromagnetic secondary radiation of the first and the second converter particles.

Preferably, the primary radiation and the secondary radiation, when superimposed, can give an impression of white-colored light. To this end, the primary radiation can preferably give an impression of blue-colored light, the secondary radiation of the first converter particles can give an impression of red-colored light and the secondary radiation of the second converter particles can give an impression of yellow-colored light.

The optoelectronic device may emit white light at a color temperature of 2200 K to 5700 K.

An adhesive layer may be arranged between the layer sequence and the conversion element. The adhesive layer can comprise or consist of, e.g. silicones or epoxy resins. Epoxy resins are used in particular if a light in the non-blue range is emitted.

The fact that a layer or an element is arranged "between" two other layers or elements, means that the one layer or the one element is arranged directly in direct mechanical and/or electrical contact or is arranged in indirect contact with one of the two other layers or elements and is arranged in direct mechanical and/or electrical contact or electrical or in indirect contact with others of the two other layers or elements. In indirect contact, further layers and/or elements can then be arranged between the one layer and at least one of the two other layers or between the one element and at least one of the two other elements.

If the first or the first and second converter particles are completely embedded into the platelet, the conversion element can be arranged over the layer sequence such that the first or the second major surface of the platelet faces towards the layer sequence.

If the first converter particles are partially embedded in the platelet and/or arranged on the platelet, the conversion element can be arranged over the layer sequence such that the second major surface of the platelet faces towards the layer sequence.

The optoelectronic device can comprise a housing. The center of the housing can be provided with a recess. The layer sequence can be provided in the recess. The recess can be filled with a casting compound.

The conversion element may be arranged over the casting compound. The casting compound can be selected from conventional casting compound materials.

The optoelectronic device can be luminescent diodes, photodiode-transistor arrays/modules and optical couplers. Alternatively, it is possible to select an organic light-emitting diode as an optoelectronic device.

Further advantages and developments are apparent from the examples described below in conjunction with the figures.

In the examples and figures, like components or components acting in an identical manner are each provided with like reference numerals. The illustrated elements and their size ratios with respect to each other are not to be considered as being to scale. Rather individual elements, in particular layer thicknesses, can be illustrated excessively large for improved understanding.

The conversion element 1 in accordance with FIG. 1a comprises a platelet 2 consisting of an inorganic glass, e.g. borate glass. The platelet is, e.g. 200 µm thick. First converter particles 3 are arranged in the platelet and have a diameter of 30 µm. Deviations in the diameter of up to 10% are possible. The first converter particles 3 are completely embedded into the inorganic glass of the platelet 2 and in direct mechanical contact therewith. The first converter particles 3 consist of a core 3b and a shell 3a. The core 3b consists of a nitride luminescent material of the formula $M_2SiN_8:Eu^{2+}$ where M=Ca, Sr, Ba or mixtures thereof and emits light in the red wavelength range of the electromagnetic spectrum. The shell 3a consists, e.g. of $SiO_2$. As shown in FIG. 1a, the platelet 2 has a first major surface 2a and a second major surface 2b. The first major surface 2a is located at a smaller spaced interval from the first converter particles 3 than the second major surface 2b. This results from production of the conversion element 1, in which in one example only one surface layer of the first major surface 2a of the platelet 2 is fused, the first converter particles 3 are applied and sink in. By applying the first converter particles 3 to the fused surface layer of the first major surface 2a of the platelet 2, the shell 3a of the first converter particles 3 is fused. This produces between the inorganic glass and the material of the shell 3a covalent and/or ionic bonds, whereby the first converter particles 3 are fixedly integrated into and attached to the platelet 2. A reflective layer and/or anti-reflective layer can be arranged over the second major surface (not shown here).

Figure 1B:
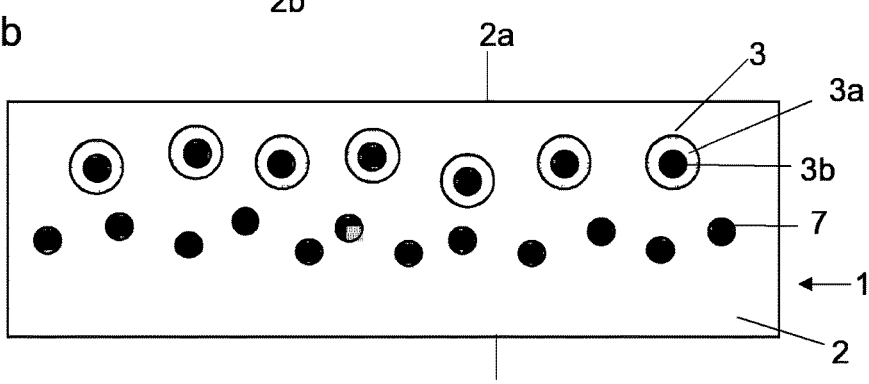

The conversion element 1 in accordance with FIG. 1b additionally shows, compared to the conversion element 1 of FIG. 1a, second converter particles 7 arranged in the platelet 2 and completely embedded into the inorganic glass of the platelet 2. The second converter particles 7 consist of an oxide luminescent material, e.g. LuAG. The conversion element 1 in accordance with this example is produced in that first the second converter particles 7 are applied to a fused surface layer of the first major surface 2a of the platelet 2, the second converter particles are allowed to sink in and subsequently the first converter particles 3 are applied to the fused surface layer of the first major surface 2a of the platelet 2 and sink in.

Figure 2A:
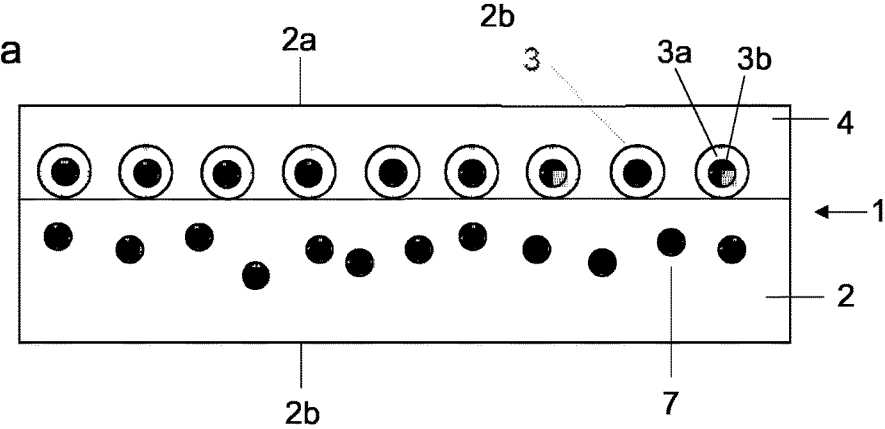

The conversion element 1 in accordance with FIG. 2a comprises a platelet 2 consisting of an inorganic glass, e.g. quartz glass. The platelet 2 is, e.g. 200 µm thick. First converter particles 3 are arranged on the platelet 2. The first converter particles 3 consist of a core 3b and a shell 3a. The core 3b consists of a nitride luminescent material of the formula $M_2SiN_8:Eu^{2+}$ where M=Ca, Sr, Ba or mixtures thereof and emits light in the red wavelength range of the electromagnetic spectrum. The shell 3a consists, e.g. of AlN. When the first converter particles 3 are applied to the fused surface layer of the first major surface 2a of the platelet 2, the first converter particles 3 are not sunk in. It is possible that some of the first converter particles 3 partially sink into the fused surface layer so that they are partially embedded into the platelet 2. Second converter particles 7 are arranged in the platelet 2 and completely embedded into the inorganic glass. The second converter particles 7 consist of an oxide luminescent material, e.g. YAG. A protective layer 4 is arranged on the first major surface 2a of the platelet 2. The protective layer 4 consists, e.g. of parylene. The protective layer 4 is, e.g. 40 µm thick. It covers the first converter particles 3 completely so that the first converter particles are in direct mechanical contact with the inorganic material of the platelet 2 and/or the protective layer 4. Therefore, the first converter particles 3 do not have any contact with the ambient air. Alternatively, second converter particles 7 also may not be present in the conversion element 1.

Figure 2B:
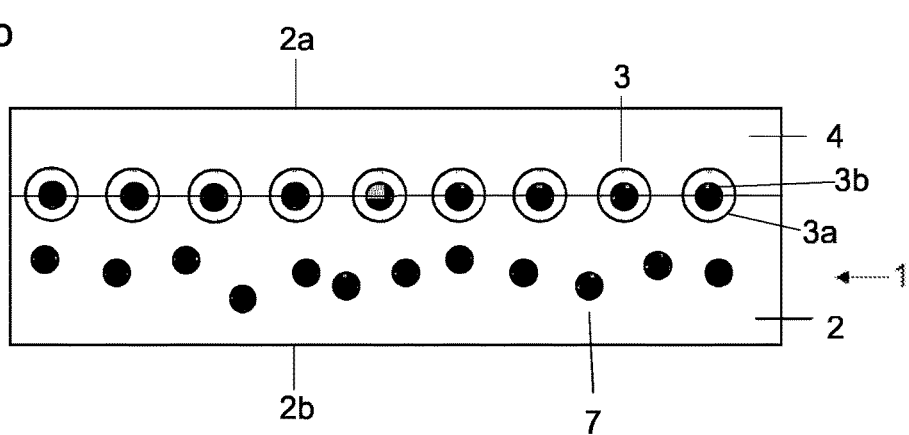

The conversion element 1 in accordance with FIG. 2b shows, compared to the conversion element in FIG. 2a, that the first converter particles 3 are partially embedded into the inorganic glass of the platelet 2. During the production process, the first converter particles 3 are thus sunk partially into the fused surface layer of the first major surface 2a of the platelet 2. Alternatively, second converter particles 7 also may not be present in the conversion element 2.

Figure 3:
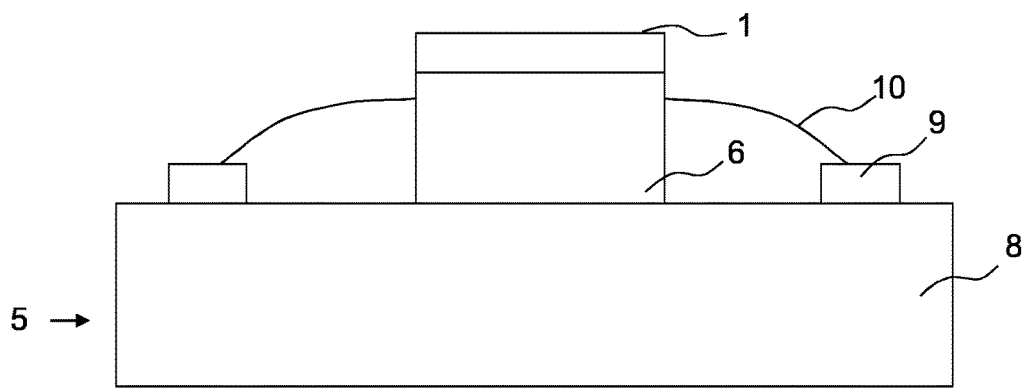
FIGS. 3 and 4 show schematic side views of different examples of optoelectronic devices.

The optoelectronic device 5 in accordance with FIG. 3 comprises a carrier 8 having a lead frame 9. Arranged on the carrier 8 is a layer sequence 6 electrically connected to the lead frame 9 via bond wires 10. A conversion element 1 is provided over the layer sequence 6. The conversion element 1 corresponds to a conversion element 1 which is illustrated in FIG. 1a, 1b, 2a or 2b. The conversion element 1 of FIGS. 1a to 2b can be arranged such that the first major surface 2a or the second major surface 2b of the platelet 2 faces towards the layer sequence 6. Preferably, in conversion elements 1 in accordance with FIGS. 2a and 2b, the second major surface 2b faces towards the layer sequence 6. If the conversion element 1 of FIGS. 1a to 2b has an anti-reflective and/or reflective layer (not shown), the conversion element 1 is arranged such that the second major surface 2b of the platelet 2 faces towards the layer sequence 6. The conversion element 1 is arranged in the beam path of the electromagnetic primary radiation emitted by an active layer (not illustrated separately here) in the layer sequence 6. The conversion element 1 is stable with respect to temperature and humidity loads as well as radiation exposure. It does not become cloudy or does so only slightly and does not become yellow or does so only slightly. This ensures that the luminous efficiency is not reduced or is only slightly reduced and the emission characteristic of the optoelectronic device 5 is not changed or is changed only slightly. An anti-reflective and/or reflective layer can have a bandpass or edge filter characteristic and can be transmissive to the primary radiation (anti-reflective) and reflective to the secondary radiation.

In addition, an adhesive layer (not shown here) can be applied between the layer sequence 6 and the conversion element 1. The adhesive layer can comprise, e.g. silicone.

Preferably, the optoelectronic device 5 is an LED, wherein, in the figure the radiation is coupled out upwards via a transparent layer sequence 6 and the conversion element 1.

Figure 4:
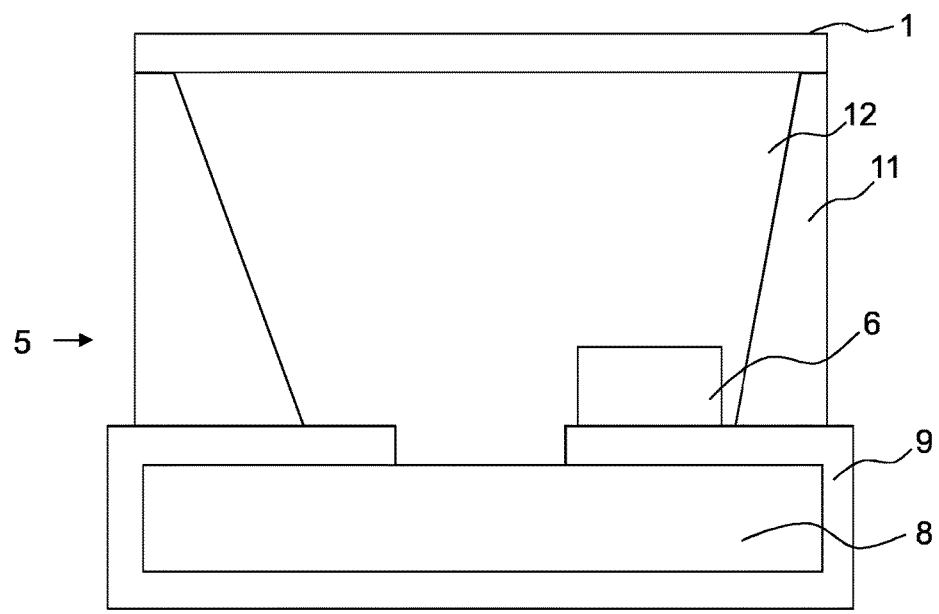

The optoelectronic device 5 in accordance with FIG. 4 comprises a carrier 8 having a lead frame 9, and a housing 11. The center of the housing 11 has a recess in which the layer sequence 6 is arranged and electrically conductively connects to the lead frame 9. The recess is filled with a casting compound 12. The casting compound 12 comprises, e.g. a silicone or epoxy.

A conversion element 1 is arranged over the recess of the housing 11 and the housing 11. The conversion element 1 is arranged in the beam path of the electromagnetic primary radiation which is emitted by an active layer (not illustrated separately here) in the layer sequence 6.

The conversion element 1 corresponds to a conversion element 1 which is illustrated in FIG. 1a, 1b, 2a or 2b.

In addition, an adhesive layer (not shown here) can be provided between the housing 11 and the conversion element 1 and between the casting compound 12 and the conversion element 1. The adhesive layer can comprise, e.g. silicone.

Preferably, the optoelectronic device 1 is an LED, wherein, in the figure the radiation is coupled out upwards via a transparent layer sequence 6, a transparent casting compound 12 and the conversion element 1.

Our elements, methods and devices are not limited by the description made with reference to the examples. Rather, this disclosure encompasses any new feature and any combination of features, including in particular any combination of features in the appended claims, even if the feature or combination is not itself explicitly indicated in the claims or examples.

This application claims priority of DE 10 2014 102 848.1 and DE 10 2013 114 548.5, the subject matter of which is incorporated herein by reference.

The invention claimed is:

1. A light emitting diode comprising:
    a layer sequence having an active layer that emits electromagnetic primary radiation during operation of the device,
    at least one conversion element arranged in a beam path of the electromagnetic primary radiation and over the layer sequence, wherein the conversion element comprises:
    a platelet comprising an inorganic glass, and
    first converter particles consisting of a shell and a core,
    wherein the shell has a thickness of 100 nm to 50 µm and consists of an inorganic material selected from the group consisting of $SiO_2$, TiO, $TiO_2$, $Al_2O_3$, $B_2O_3$, ZrO, $ZrO_2$, ZnO, $ZnO_2$ and an inorganic-organic hybrid material,
    the core consists of a nitride or oxynitride luminescent material,
    the first converter particles are arranged on and/or in the platelet,
    the first converter particles convert the electromagnetic primary radiation at least partially into an electromagnetic secondary radiation,
    a chemical bond exists between the inorganic material of the shell of the first converter particles and the inorganic glass of the platelet, and
    the chemical bond is an ionic and/or covalent bond.

2. The light emitting diode according to claim 1, wherein the first converter particles have a diameter of at least 10 µm to at the most 100 µm.

3. The light emitting diode according to claim 1, wherein the platelet has a protective layer arranged thereover and comprises a material which is selected from the group consisting of parylene, polysilazane, silicone, $SiO_2$, TiO, $TiO_2$, $Al_2O_3$, $B_2O_3$, ZrO, $ZrO_2$, ZnO, $ZnO_2$, an inorganic-organic hybrid material, AlN, BN, TiN, $Si_3N_4$, ZrN, $Zn_3N_2$, graphene and an inorganic glass.

4. The light emitting diode according to claim 1, wherein the first converter particles are embedded completely into the inorganic glass of the platelet or completely into the inorganic glass of the platelet and the material of the protective layer.

5. The light emitting diode according to claim 1, further comprising second converter particles comprising an oxide luminescent material.

6. The light emitting diode according to claim 5, wherein the second converter particles are arranged on and/or in the platelet.

7. The light emitting diode according to claim 1, wherein the inorganic glass is a silicate glass, a borate glass or a phosphate glass.

8. A method of producing a conversion element comprising:
    a platelet comprising an inorganic glass, and
    first converter particles having a shell and a core,
    wherein the first converter particles are arranged on and/or in the platelet,
    the method comprising:
    A) coating particles of a nitride or oxynitride luminescent material with an inorganic material selected from the group consisting of $SiO_2$, TiO, $TiO_2$, $Al_2O_3$, $B_2O_3$, ZrO, $ZrO_2$, ZnO, $ZnO_2$ and an inorganic-organic hybrid material to form the first converter particles, wherein the shell consists of the inorganic material and the core consists of the nitride or oxynitride luminescent material,
    B) producing a glass frit or a powder consisting of an inorganic glass,
    C) mixing the glass frit or the powder with the first converter particles and a liquid dispersant so that a basic molding compound is produced,
    D) casting the basic molding compound to form a crude conversion element body or to form the platelets, wherein the dispersant completely or only partially evaporates, and G) sintering the platelets or the crude conversion element body so that the inorganic glass becomes fixedly and durably connected to the first converter particles.

9. The method according to claim 8, further comprising steps performed according to the listed sequence of A to H, of: E) dividing up the crude conversion element body into the conversion elements, wherein, in D) the crude conversion element body is formed, F) removing a binder added to the basic molding compound in C) so that exclusively the inorganic glass and the converter particles remain in the basic molding compound, and H) shaping to form the conversion elements and the platelets from the crude conversion element body.

10. The method according to claim 8, wherein a slurry or a gel comprising the inorganic material, or the inorganic material in a gaseous state of aggregation coats the particles of the nitride or oxynitride luminescent material in A).

11. A light emitting diode comprising:
a layer sequence having an active layer that emits electromagnetic primary radiation during operation of the device,
at least one conversion element arranged in a beam path of the electromagnetic primary radiation and over the layer sequence, wherein the conversion element comprises:
a platelet comprising an inorganic glass, and
first converter particles consisting of a shell and a core, wherein the shell comprises an inorganic material and the core comprises a nitride or oxynitride luminescent material and
the first converter particles are arranged on and/or in the platelet, wherein
the first converter particles convert the electromagnetic primary radiation at least partially into an electromagnetic secondary radiation,
at least some of the first converter particles are arranged on a first major surface of the platelet, are partially embedded in the platelet and partially protrude from the platelet at the first major surface, and
a protective layer is arranged over the first major surface.

12. The light emitting diode according to claim 1, wherein the oxynitride and nitride luminescent materials are doped with one of the following activators or combinations of the following activators: cerium, europium, terbium, praseodymium, samarium, manganese.

13. The light emitting diode according to claim 11, wherein the primary radiation and the secondary radiation, when superimposed, give an impression of white-colored light.

14. The light emitting diode according to claim 11, wherein the layer sequence is designed as a radiation-emitting semiconductor chip having an epitaxial layer sequence.

15. The light emitting diode according to claim 11, wherein the layer sequence is designed on the basis of InGaAlN or InGaAlP.

16. The light emitting diode according to claim 11, wherein the active layer emits electromagnetic radiation in an ultraviolet to green wavelength range.

* * * * *